US012641352B2

(12) United States Patent (10) Patent No.: US 12,641,352 B2
Kubo (45) Date of Patent: May 26, 2026

(54) SOLID-STATE IMAGING DEVICE AND ELECTRONIC APPARATUS FOR MAINTAINING OPTICAL SYMMETRY

(71) Applicant: SONY SEMICONDUCTOR SOLUTIONS CORPORATION, Kanagawa (JP)

(72) Inventor: Norihiro Kubo, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 227 days.

(21) Appl. No.: 18/255,804

(22) PCT Filed: Oct. 21, 2021

(86) PCT No.: PCT/JP2021/038928
§ 371 (c)(1),
(2) Date: Jun. 2, 2023

(87) PCT Pub. No.: WO2022/123921
PCT Pub. Date: Jun. 16, 2022

(65) Prior Publication Data
US 2024/0007768 A1 Jan. 4, 2024

(30) Foreign Application Priority Data
Dec. 10, 2020 (JP) ................................. 2020-205340

(51) Int. Cl.
*H04N 25/77* (2023.01)
*H04N 25/779* (2023.01)
(Continued)

(52) U.S. Cl.
CPC ........... *H04N 25/77* (2023.01); *H04N 25/779* (2023.01); *H04N 25/78* (2023.01); *H10F 39/813* (2025.01)

(58) Field of Classification Search
CPC ...... H04N 25/77; H04N 25/779; H04N 25/78; H04N 25/59; H04N 25/771; H04N 25/778;
(Continued)

(56) References Cited

U.S. PATENT DOCUMENTS 11,463,645 B2 * 10/2022 Obata ...................... H10F 39/18
2010/0230579 A1 * 9/2010 Watanabe ............ H04N 25/532
250/214 A
(Continued)

FOREIGN PATENT DOCUMENTS

JP 2013-017241 A 1/2013
JP 2013-033896 A 2/2013
(Continued)

OTHER PUBLICATIONS

International Search Report and Written Opinion of PCT Application No. PCT/JP2021/038928, issued on Jan. 18, 2022, 08 pages of ISRWO.

*Primary Examiner* — Hung H Lam
(74) *Attorney, Agent, or Firm* — CHIP LAW GROUP

(57) ABSTRACT

There are provided a solid-state imaging device and an electronic apparatus that can enhance the conversion efficiency to a degree similar to that of a non-sharing pixel and can maintain the optical symmetry also in a case where sharing between pixels is performed. The solid-state imaging device includes a plurality of pixels arranged in a matrix, and each of the plurality of pixels includes a photoelectric conversion unit that photoelectrically converts incident light, a floating diffusion portion in which signal charge generated by the photoelectric conversion unit is stored, an amplification transistor that amplifies a potential corresponding to an amount the signal charge stored in the floating diffusion portion, and output a pixel signal corresponding to the amplified potential, and a conversion-effi-
(Continued)

ciency adjustment transistor that adjusts a conversion efficiency of the signal charge stored in the floating diffusion portion.

12 Claims, 10 Drawing Sheets

(51) Int. Cl.
H04N 25/78 (2023.01)
H10F 39/00 (2025.01)
(58) Field of Classification Search
CPC ...... H10F 39/813; H10F 39/12; H10F 39/802;
H10F 39/8037
See application file for complete search history.

(56) References Cited

U.S. PATENT DOCUMENTS

2016/0165159 A1* 6/2016 Hseih ................... H10F 39/813
348/273
2020/0106975 A1* 4/2020 Oike ...................... H04N 25/77

FOREIGN PATENT DOCUMENTS

| JP | 2014-112580 A | 6/2014 |
| JP | 2017-004985 A | 1/2017 |
| JP | 2017-175164 A | 9/2017 |

* cited by examiner

SOLID-STATE IMAGING DEVICE AND ELECTRONIC APPARATUS FOR MAINTAINING OPTICAL SYMMETRY

CROSS REFERENCE TO RELATED APPLICATIONS

This application is a U.S. National Phase of International Patent Application No. PCT/JP2021/038928 filed on Oct. 21, 2021, which claims priority benefit of Japanese Patent Application No. JP 2020-205340 filed in the Japan Patent Office on Dec. 10, 2020. Each of the above-referenced applications is hereby incorporated herein by reference in its entirety.

TECHNICAL FIELD

The technology (present technology) according to the present disclosure relates to a solid-state imaging device and an electronic apparatus including the solid-state imaging device.

BACKGROUND ART

As a solid-state imaging device, a complementary metal oxide semiconductor (CMOS) image sensor is known. Because of a low power supply voltage and low power consumption thereof, a CMOS image sensor is used for various mobile terminal devices such as a digital still camera, a digital video camera, and a camera-equipped mobile phone, a printer, and the like. Furthermore, a CMOS image sensor includes a plurality of pixel transistors in addition to a photodiode in which pixels arranged in a pixel region are photoelectric conversion units. As described above, a photodiode and a plurality of pixel transistors are required to form one unit pixel, which makes it difficult to reduce the size of a pixel.

In recent years, a so-called multi-pixel sharing structure in which a pixel transistor is shared by a plurality of pixels to reduce an area covered by others than a photodiode in one pixel, is an essential technology (for example, Patent Document 1).

Meanwhile, though an increase of the number of sharing pixels can increase the area of a photodiode, a distance between a floating diffusion (FD) portion and an amplification transistor as a pixel transistor is increased, so that a FD wire length is increased. Moreover, also a diffusion capacitance of a FD portion increases, and hence the conversion efficiency decreases. Note that there is also a technology in which a capacitive element is connected to a FD portion in order to maintain the conversion efficiency (for example, Patent Document 2).

CITATION LIST

Patent Document

Patent Document 1: Japanese Patent Application Laid-Open No. 2017-175164
Patent Document 2: Japanese Patent Application Laid-Open No. 2013-33896

SUMMARY OF THE INVENTION

Problems to be Solved by the Invention

Meanwhile, in a surveillance camera and a solid-state imaging device for mobile devices that prioritize low illuminance characteristics, a pixel that can be designed with high conversion efficiency is a highly appealing product. Therefore, a pixel design by which high conversion efficiency can be maintained also in a case where sharing between pixels is performed is desired. Furthermore, in sharing between pixels, transfer transistors are placed so as to face each other to share a FD portion, and thus optical symmetry is broken.

The present disclosure has been made in view of such circumstances, and an object of the present disclosure is to provide a solid-state imaging device and an electronic apparatus that can enhance the conversion efficiency to a degree similar to that of a non-sharing pixel and can maintain the optical symmetry also in a case where sharing between pixels is performed.

Solutions to Problem

An aspect of the present disclosure is directed to a solid-state imaging device including a plurality of pixels arranged in a matrix, in which each of the plurality of pixels includes: a photoelectric conversion unit configured to photoelectrically convert incident light; a floating diffusion portion in which signal charge generated by the photoelectric conversion unit is stored; an amplification transistor configured to amplify a potential corresponding to an amount of the signal charge stored in the floating diffusion portion, and output a pixel signal corresponding to the amplified potential; and a conversion-efficiency adjustment transistor configured to adjust a conversion efficiency of the signal charge stored in the floating diffusion portion, and at least a part of the plurality of pixels forms sharing pixels, and a transistor other than the amplification transistor and the conversion-efficiency adjustment transistor is shared by a plurality of pixels forming the sharing pixels.

Another aspect of the present disclosure is directed to an electronic apparatus including a solid-state imaging device including a plurality of pixels arranged in a matrix, in which each of the plurality of pixels includes: a photoelectric conversion unit configured to photoelectrically convert incident light; a floating diffusion portion in which signal charge generated by the photoelectric conversion unit is stored; an amplification transistor configured to amplify a potential corresponding to an amount of the signal charge stored in the floating diffusion portion, and output a pixel signal corresponding to the amplified potential; and a conversion-efficiency adjustment transistor configured to adjust a conversion efficiency of the signal charge stored in the floating diffusion portion, and at least a part of the plurality of pixels forms sharing pixels, and a transistor other than the amplification transistor and the conversion-efficiency adjustment transistor is shared by a plurality of pixels forming the sharing pixels.

MODE FOR CARRYING OUT THE INVENTION

Hereinafter, embodiments of the present disclosure will be described with reference to the drawings. In the description of the drawings referred to in the following description, the same or similar parts are denoted by the same or similar reference signs, and duplicated description is omitted. Meanwhile, it should be noted that the drawings are schematic, and the relationship between the thickness and the planar size, the ratio in the thickness between respective devices and respective members, and the like are different from actual ones. Therefore, specific thicknesses and sizes should be determined in consideration of the following description. Furthermore, it is needless to say that the drawings include portions having sizes in different relationships or having different ratios, respectively.

Furthermore, the definitions of directions such as up and down in the following description are given just for convenience in description, and do not limit the technical idea of the present disclosure. For example, it is a matter of course that when an object is rotated 90° and observed, the upper and lower sides are read as left and right sides, and when an object is rotated 180° and observed, the upper and lower sides are read as being inverted.

Note that the effects described in the present specification are mere examples and are not limitative, and other effects may be produced.

First Embodiment (Overall Configuration of Solid-State Imaging Device)

Figure 1:
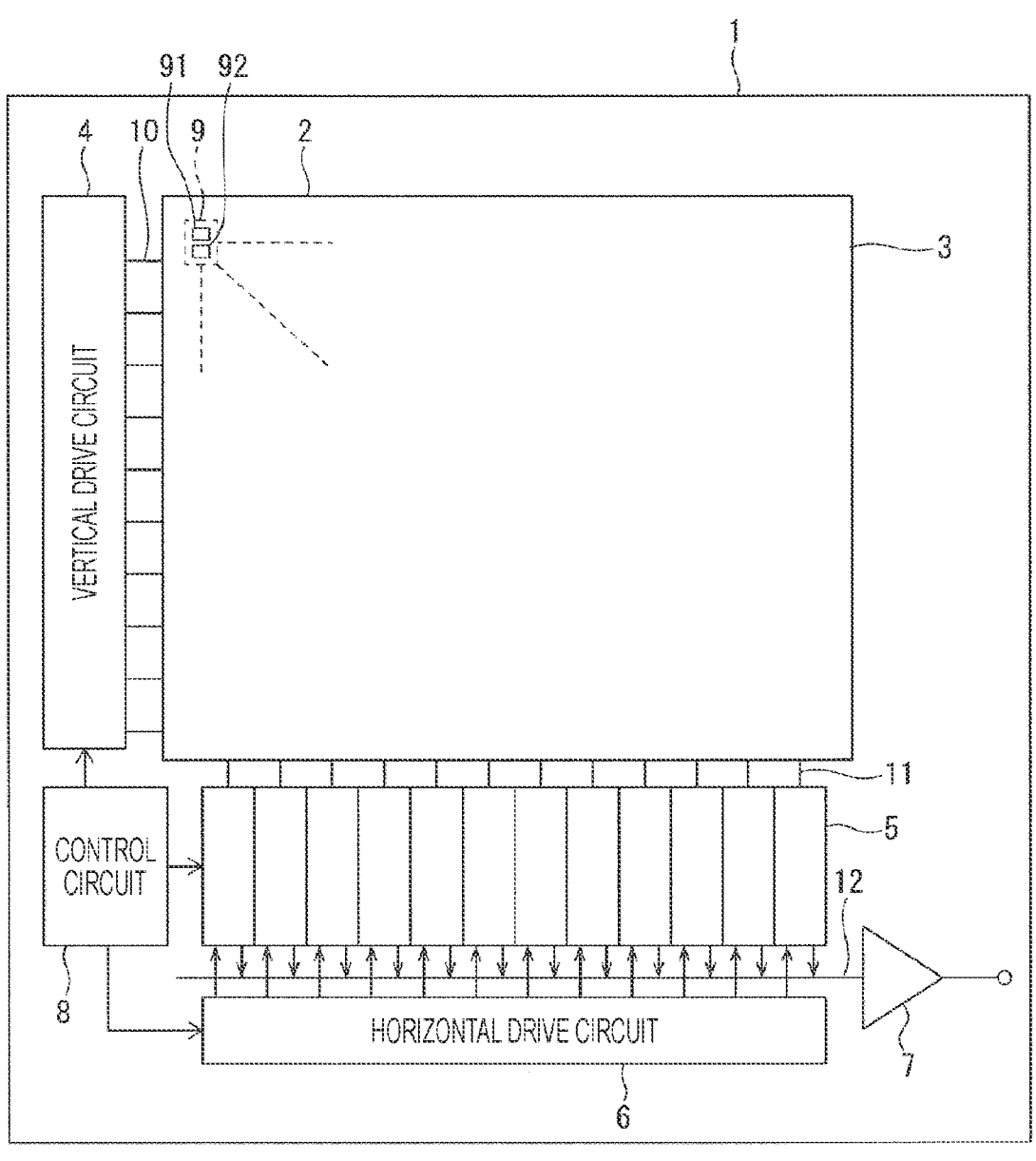
FIG. 1 is a schematic configuration diagram illustrating an entire solid-state imaging device according to a first embodiment of the present technology.

A solid-state imaging device 1 according to a first embodiment of the present technology will be described. FIG. 1 is a schematic configuration diagram illustrating the entirety of the solid-state imaging device 1 according to the first embodiment of the present technology.

The solid-state imaging device 1 in FIG. 1 is a back-illuminated complementary metal oxide semiconductor (CMOS) image sensor. The solid-state imaging device 1 takes in image light from a subject via an optical lens, converts the amount of incident light formed on an imaging surface into an electrical signal on a pixel-by-pixel basis, and outputs the electrical signal as a pixel signal.

As illustrated in FIG. 1, the solid-state imaging device 1 of the first embodiment includes a substrate 2, a pixel region 3, a vertical drive circuit 4, a column signal processing circuit 5, a horizontal drive circuit 6, an output circuit 7, and a control circuit 8.

The pixel region 3 has a plurality of sharing pixels 9 regularly arranged in a two-dimensional array on the substrate 2. The sharing pixels 9 conform to a two-pixel sharing system and includes a pixel 91 and a pixel 92, for example.

The vertical drive circuit 4 includes, for example, a shift register, selects a desired pixel drive line 10, and supplies a pulse for driving the sharing pixels 9 to the selected pixel drive line 10, to drive each sharing pixels 9 on a row-by-row basis. Specifically, the vertical drive circuit 4 selectively scans each sharing pixel 9 in the pixel region 3 sequentially in the vertical direction on a row-by-row basis, and supplies a pixel signal based on signal charge generated in accordance with the amount of light received by a photoelectric conversion unit of each sharing pixel 9, to the column signal processing circuit 5 through a vertical signal line 11.

The column signal processing circuit 5 is provided, for example, for each column of the sharing pixels 9, and performs signal processing, such as noise removal, on signals output from the sharing pixels 9 in a row, for each pixel column. For example, the column signal processing circuit 5 performs signal processing such as correlated double sampling (CDS) for removing a pixel-specific fixed pattern noise, and analog digital (AD) conversion.

The horizontal drive circuit 6 includes, for example, a shift register, sequentially outputs horizontal scanning pulses to the column signal processing circuits 5, sequentially selects each of the column signal processing circuits 5, and causes each of the column signal processing circuits 5 to output a pixel signal having been subjected to signal processing, to a horizontal signal line 12.

The output circuit 7 performs signal processing on the pixel signals sequentially supplied from each of the column signal processing circuits 5 through the horizontal signal line 12, and outputs the pixel signals. As the signal processing, for example, buffering, black level adjustment, column variation correction, various kinds of digital signal processing, and the like can be used.

The control circuit 8 generates a clock signal or a control signal serving as a reference of operations of the vertical drive circuit 4, the column signal processing circuit 5, the horizontal drive circuit 6, and the like, on the basis of a vertical synchronization signal, a horizontal synchronization signal, and a master clock signal. Then, the control circuit 8 outputs the generated clock signal and control signal to the vertical drive circuit 4, the column signal processing circuit 5, the horizontal drive circuit 6, and the like.

(Equivalent Circuit of Sharing Pixels)

Figure 2:
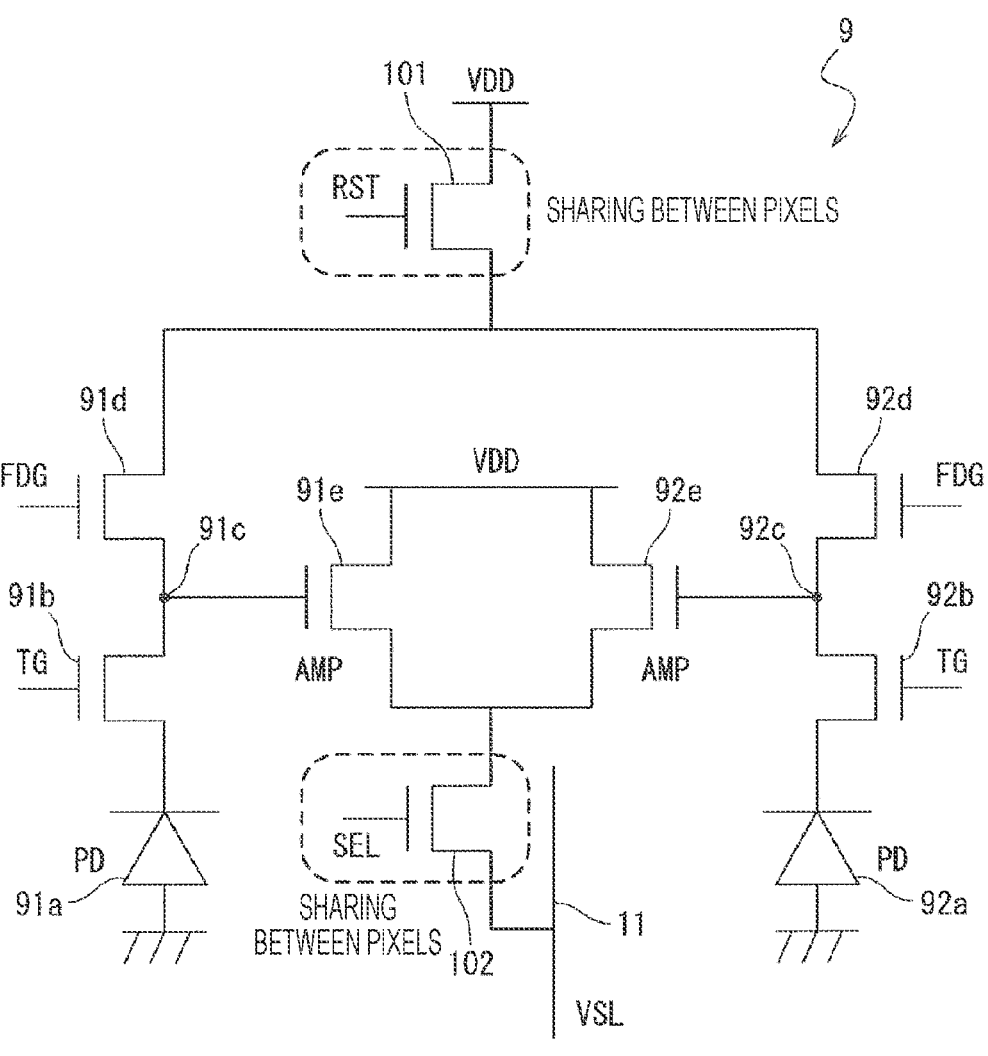
FIG. 2 is a circuit diagram illustrating an equivalent circuit of sharing pixels of a two-pixel sharing system in the first embodiment.

FIG. 2 illustrates an equivalent circuit of the sharing pixels 9 of the two-pixel sharing system.

The sharing pixels 9 include a photodiode (PD) 91*a* for the pixel 91, a transfer transistor (TG) 91*b* for the pixel 91, a floating diffusion (FD) portion 91*c* for the pixel 91, a conversion-efficiency adjustment transistor (FDG) 91*d* for the pixel 91, and an amplification transistor 91*e* for the pixel 91. Furthermore, the sharing pixels 9 include a photodiode (PD) 92*a* for the pixel 92, a transfer transistor (TG) 92*b* for the pixel 92, a floating diffusion (FD) portion 92*c* for the pixel 92, a conversion-efficiency adjustment transistor (FDG) 92*d* for the pixel 92, and an amplification transistor 92*e* for the pixel 92. Moreover, the sharing pixels 9 include a reset transistor (RST) 101 and a selection transistor (SEL) 102 that are shared by the pixel 91 and the pixel 92. The transfer transistors (TG) 91b and 92b, the conversion-efficiency adjustment transistors (FDG) 91d and 92d, the amplification transistors 91e and 92e, the reset transistor (RST) 101, and the selection transistor (SEL) 102 are pixel transistors, and include, for example, MOS transistors.

The photodiode 91a for the pixel 91 forms a photoelectric conversion unit that photoelectrically converts incident light. The anode of the photodiode 91a is grounded. The cathode of the photodiode 91a is connected to the source of the transfer transistor 91b.

The drain of the transfer transistor 91b is connected to the FD portion 91c. The transfer transistor 91b transfers signal charge from the photodiode 91a to the FD portion 91c in response to a transfer signal applied to the gate.

The FD portion 91c stores therein the signal charge transferred from the photodiode 91a via the transfer transistor 91b. The potential of the FD portion 91c is modulated in accordance with the amount of the signal charge stored in the FD portion 91c.

The FD portion 91c is connected to the source of the conversion-efficiency adjustment transistor 91d. The drain of the conversion-efficiency adjustment transistor 91d is connected to the drain of the conversion-efficiency adjustment transistor 92d for the pixel 92 and the source of the reset transistor 101. The conversion-efficiency adjustment transistor 91d adjusts the conversion efficiency of signal charge in response to a conversion-efficiency adjustment signal applied to the gate.

The FD portion 91c is connected to the gate of the amplification transistor 91e. The drain of the amplification transistor 91e is connected to the source of the selection transistor 102 and the drain of the amplification transistor 92e for the pixel 92. The source of the amplification transistor 91e is applied with a power supply potential (VDD). The amplification transistor 91e amplifies the potential of the FD portion 91c.

Meanwhile, the photodiode 92a for the pixel 92 forms a photoelectric conversion unit that photoelectrically converts incident light. The anode of the photodiode 92a is grounded. The cathode of the photodiode 92a is connected to the source of the transfer transistor 92b for the pixel 92.

The drain of the transfer transistor 92b is connected to the FD portion 92c for the pixel 92. The transfer transistor 92b transfers signal charge from the photodiode 92a to the FD portion 92c in response to a transfer signal applied to the gate.

The FD portion 92c stores therein the signal charge transferred from the photodiode 92a via the transfer transistor 92b. The potential of the FD portion 92c is modulated in accordance with the amount of signal charge stored in the FD portion 92c.

The FD portion 92c is connected to the source of the conversion-efficiency adjustment transistor 92d. The drain of the conversion-efficiency adjustment transistor 92d is connected to the drain of the conversion-efficiency adjustment transistor 91d for the pixel 91 and the source of the reset transistor 101. The conversion-efficiency adjustment transistor 92d adjusts the conversion efficiency of the signal charge stored in the FD portion 92c, in response to a conversion-efficiency adjustment signal applied to the gate.

The FD portion 92c is connected to the gate of the amplification transistor 92e. The drain of the amplification transistor 92e is connected to the source of the selection transistor 102 and the drain of the amplification transistor 91e for the pixel 91. The source of the amplification transistor 92e is applied with the power supply potential (VDD). The amplification transistor 92e amplifies the potential of the FD portion 92c.

The drain of the reset transistor 101 is applied with the power supply potential (VDD). The reset transistor 101 initializes (resets) the signal charge stored in the FD portion 91c and the signal charge stored in the FD portion 92c, in response to a reset signal applied to the gate.

The drain of the selection transistor 102 is connected to the vertical signal line 11. The selection transistor 102 selects one of the pixel 91 and the pixel 92 in response to a selection signal applied to the gate. In a case where the pixel 91 is selected, a pixel signal corresponding to the potential amplified by the amplification transistor 91e is output through the vertical signal line 11. On the other hand, in a case where the pixel 92 is selected, a pixel signal corresponding to the potential amplified by the amplification transistor 92e is output through the vertical signal line 11.

Comparative Example of First Embodiment (Arrangement of Pixel Transistors of Non-Sharing System)

Figure 3:
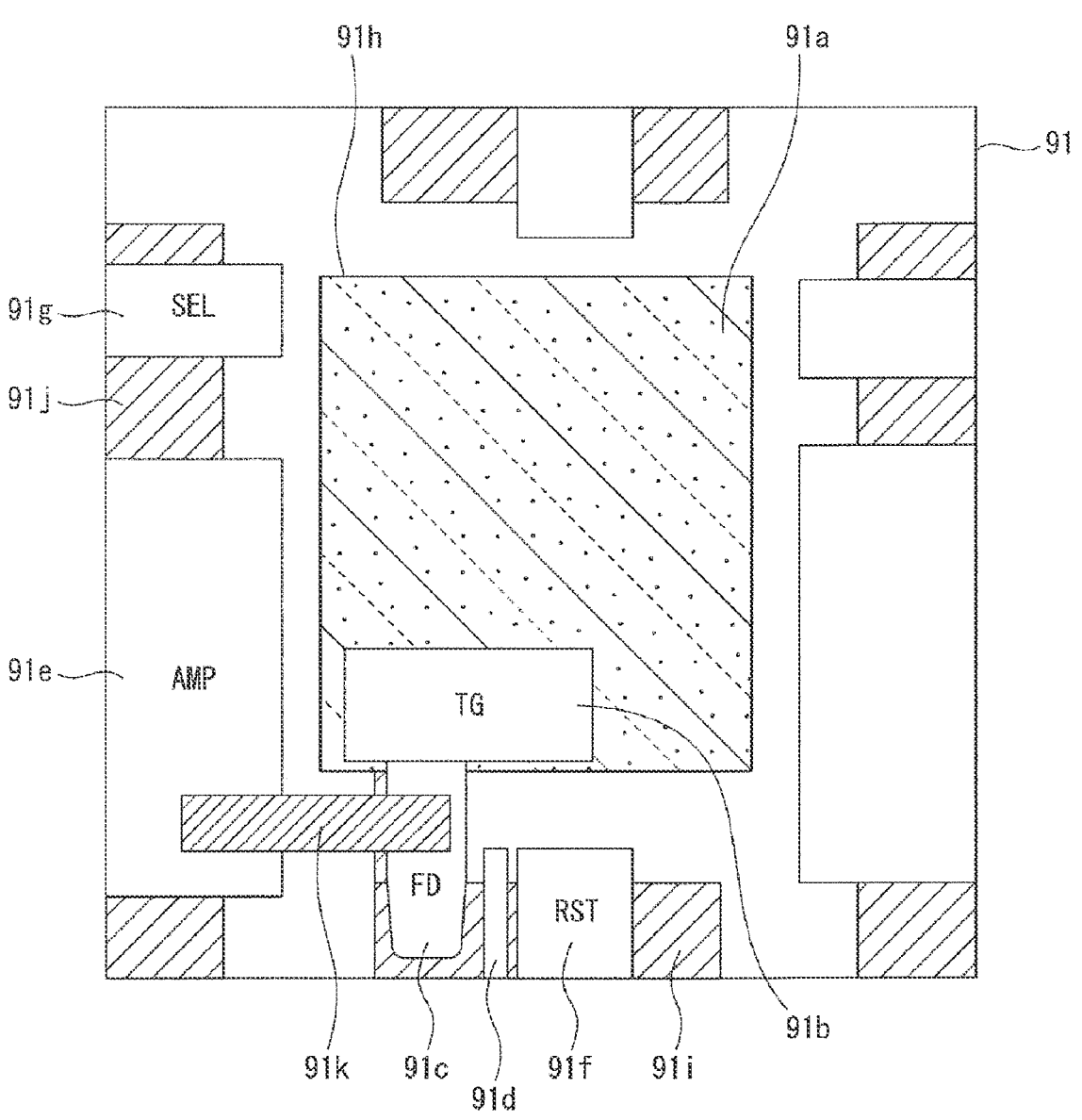
FIG. 3 is a plan view illustrating an arrangement of pixel transistors in a pixel of a non-sharing system in a comparative example of the first embodiment.

FIG. 3 is a plan view illustrating an arrangement of pixel transistors in the pixel 91 of a non-sharing system in a comparative example of the first embodiment. In FIG. 3, the same components as those in FIG. 2 described above are denoted by the same reference signs, and detailed description thereof is omitted.

The photodiode 91a and the transfer transistor (TG) 91b are provided in a photoelectric conversion region 91h. The conversion-efficiency adjustment transistor (FDG) 91d and a reset transistor (RST) 91f are provided in a wiring region 91i. The amplification transistor (AMP) 91e and the selection transistor (SEL) are provided in a wiring region 91j. The FD portion 91c is provided between the photoelectric conversion region 91h and the wiring region 91i. Note that the photoelectric conversion region 91h and the wiring regions 91i and 91j are electrically disconnected from each other.

The FD portion 91c is connected to the amplification transistor 91e by a FD wire 91k.

(Arrangement of Pixel Transistors of Two-Pixel Sharing System)

Figure 4:
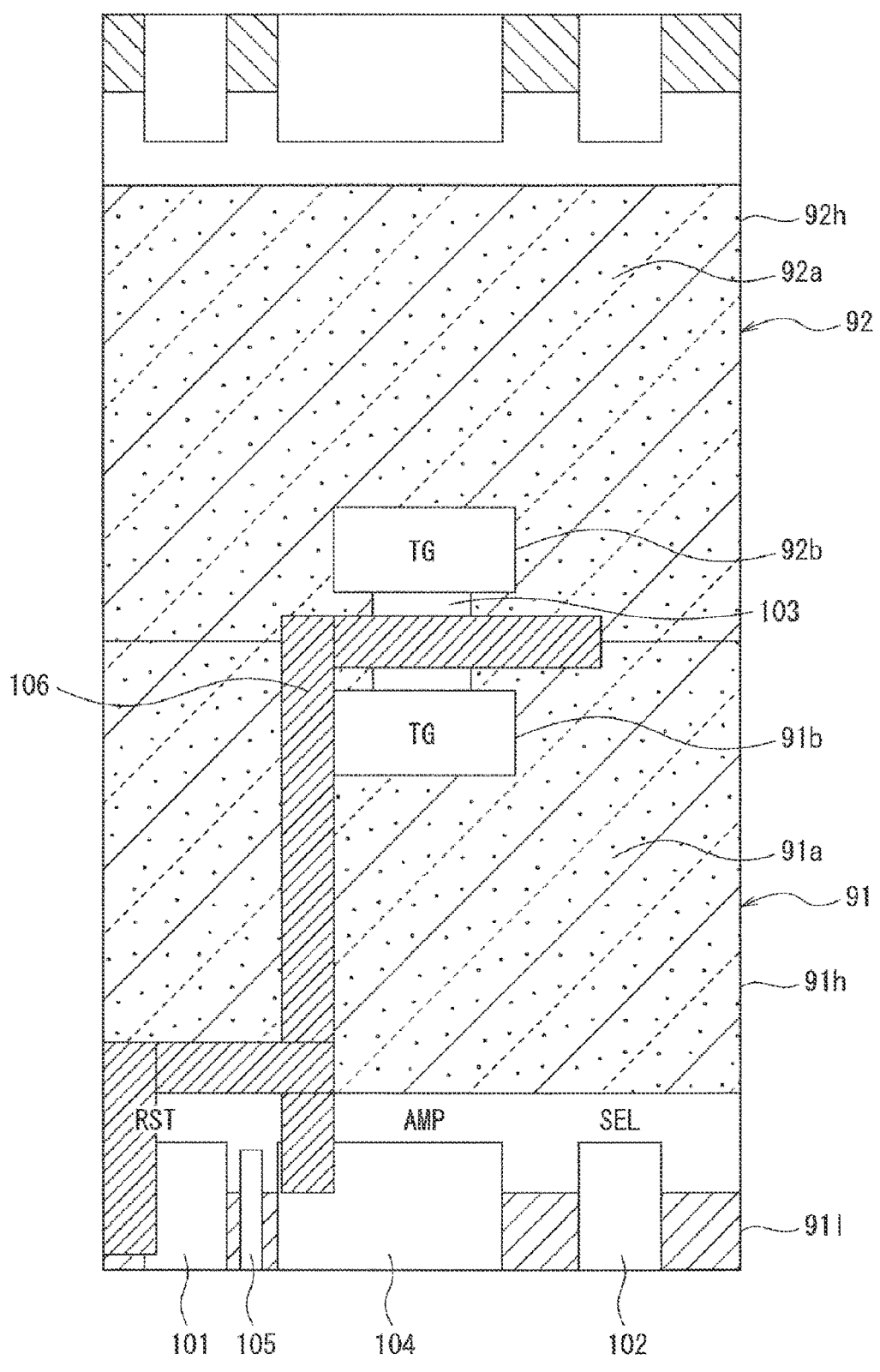
FIG. 4 is a plan view illustrating an arrangement of pixel transistors in pixels of a two-pixel sharing system in a comparative example of the first embodiment.

FIG. 4 is a plan view illustrating an arrangement of pixel transistors in the pixel 91 and the pixel 92 of the two-pixel sharing system in a comparative example of the first embodiment. In FIG. 4, the same components as those in FIG. 3 described above are denoted by the same reference signs, and detailed description thereof is omitted.

The photodiode 91a and the transfer transistor (TG) 91b for the pixel 91 are provided in the photoelectric conversion region 91h. The photodiode 92a and the transfer transistor (TG) 92b for the pixel 92 are provided in a photoelectric conversion region 92h.

Meanwhile, in the comparative example of the first embodiment, in addition to the reset transistor 101 and the selection transistor 102, a FD portion 103, an amplification transistor 104, and a conversion-efficiency adjustment transistor 105 are shared by the pixel 91 and the pixel 92. The FD portion 103 is provided between the photoelectric conversion region 91h for the pixel 91 and the photoelectric conversion region 92h for the pixel 92. The reset transistor 101, the selection transistor 102, the amplification transistor 104, and the conversion-efficiency adjustment transistor 105 are provided in a wiring region 91l of the pixel 91. The photoelectric conversion region 91h and the wiring region 91l are electrically disconnected from each other.

The FD portion 103 is connected to the reset transistor 101 and the amplification transistor 104 by a FD wire 106. In the two-pixel sharing system of this comparative example, though the area of the photo diode (PD) can be increased, a distance between the FD portion 103 and the amplification transistor 104 is increased, so that the length of the FD wire 106 is longer than that of the FD wire 91*k* of the non-sharing system. Furthermore, in the two-pixel sharing system of the comparative example, the transfer transistor 91*b* for the pixel 91 and the transfer transistor 92*b* for the pixel 92 are placed so as to face each other to share the FD portion 103, and thus the optical symmetry is broken.

Measures According to First Embodiment

Figure 5:
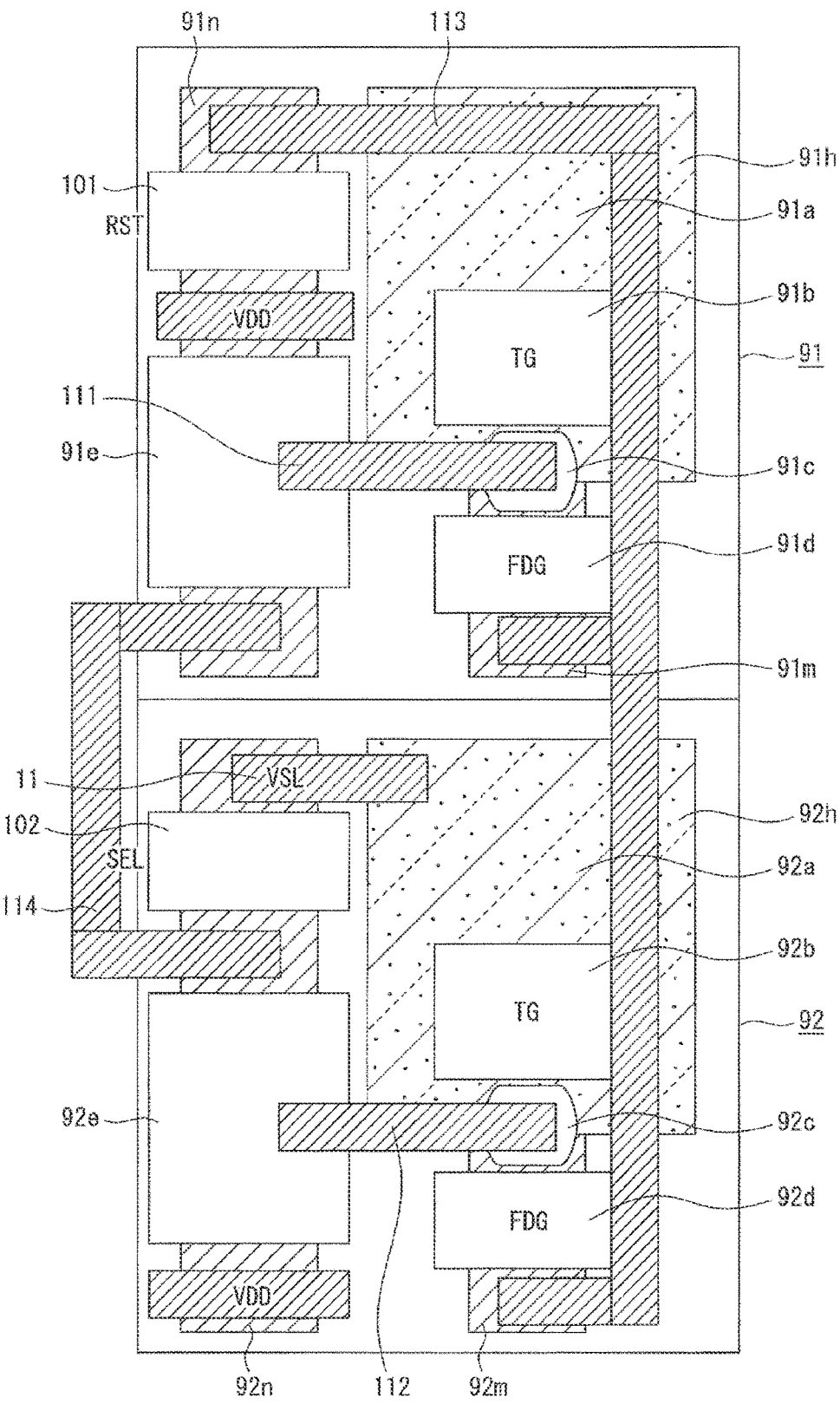
FIG. 5 is a plan view illustrating an arrangement of pixel transistors in pixels of a two-pixel sharing system according to the first embodiment.

In the first embodiment of the present technology, as illustrated in FIG. 5, the reset transistor 101 and the selection transistor 102 are shared by the pixel 91 and the pixel 92. In FIG. 5, the same components as those in FIG. 3 and FIG. 4 described above are denoted by the same reference signs, and detailed description thereof is omitted.

In the pixel 91, the conversion-efficiency adjustment transistor (FDG) 91*d* is provided in a wiring region 91*m*. The amplification transistor 91*e* and the reset transistor (RST) 101 are provided in a wiring region 91*n*. The wiring region 91*n* is connected to a supply line of the power supply potential (VDD). The FD portion 91*c* is provided between the photoelectric conversion region 91*h* and the wiring region 91*m*. Note that the photoelectric conversion region 91*h* and each of the wiring regions 91*m* and 91*n* are electrically disconnected from each other.

In the pixel 92, the conversion-efficiency adjustment transistor (FDG) 92*d* is provided in the wiring region 92*m*. The amplification transistor 92*e* and the selection transistor (SEL) 102 are provided in a wiring region 92*n*. The wiring region 92*n* is connected to the vertical signal line 11 and the supply line of the power supply potential (VDD). The FD portion 92*c* is provided between the photoelectric conversion region 92*h* and the wiring region 92*m*. Note that the photoelectric conversion region 92*h* and each of the wiring regions 92*m* and 92*n* are electrically disconnected from each other.

Meanwhile, in the pixel 91, the FD portion 91*c* and the amplification transistor 91*e* are electrically connected by a wire 111. In the pixel 92, the FD portion 92*c* and the amplification transistor 92*e* are electrically connected by a wire 112.

The conversion-efficiency adjustment transistor (FDG) 91*d*, the conversion-efficiency adjustment transistor (FDG) 92*d*, and the reset transistor (RST) 101 are electrically connected by a wire 113. The amplification transistor 91*e*, the amplification transistor 92*e*, and the selection transistor (SEL) 102 are electrically connected by the wire 113.

In the first embodiment of the present technology, the wire 113 is placed along the outer edge of the pixel 91 and the pixel 92 outside the wires 111 and 112. Furthermore, a wire 114 is placed along the outer edge of the pixel 91 and the pixel 92 outside the wires 111 and 112.

Effects Produced by First Embodiment

As described above, according to the first embodiment, also in the sharing pixels 9 including the pixel 91 and the pixel 92, the pixel 91 includes the FD portion 91*c*, the conversion-efficiency adjustment transistor 91*d*, and the amplification transistor 91*e*, and the pixel 92 includes the FD portion 92*c*, the conversion-efficiency adjustment transistor

92*d*, and the amplification transistor 92*e*. Thus, the FD wires connecting the FD portion 91*c* and the amplification transistor 91*e*, the FD portion 91*c* and the conversion-efficiency adjustment transistor 91*d*, the FD portion 92*c* and the amplification transistor 92*e*, and the FD portion 92*c* and the conversion-efficiency adjustment transistor 92*d* can be designed to have small lengths. Therefore, also in the pixel sharing system, a high conversion efficiency similar to that in the non-sharing system can be achieved. Furthermore, the configuration has a pixel layout relatively close to that of a non-sharing pixel, so that the optical symmetry can be maintained, and variation in sensitivity among the pixels 91 and 92 can be reduced.

Furthermore, according to the first embodiment, the wires 111 and 112 are respectively placed inside the pixels 91 and 92 forming the sharing pixels 9, and the wire 113 is placed along the outer edge that is a vacant space in the sharing pixels 9, outside the wires 111 and 112. This allows the respective wires 111 and 112 of the pixels 91 and 92 to be designed to have small lengths without being affected by the wire 113.

Moreover, according to the first embodiment, the wire 114 is placed along the outer edge that is a vacant space in the sharing pixels 9, outside the wires 111 and 112. This allows the respective wires 111 and 112 of the pixels 91 and 92 to be designed to have small lengths without being affected by the wire 114.

Note that the first embodiment has described the example in which the reset transistor 101 and the selection transistor 102 are shared, but a transistor other than the reset transistor 101 and the selection transistor 102, such as a discharge transistor, for example, may be shared.

Second Embodiment

Next, a second embodiment will be described. The second embodiment is a modification of the first embodiment, and will describe a case where only the reset transistor is shared.

Figure 6:
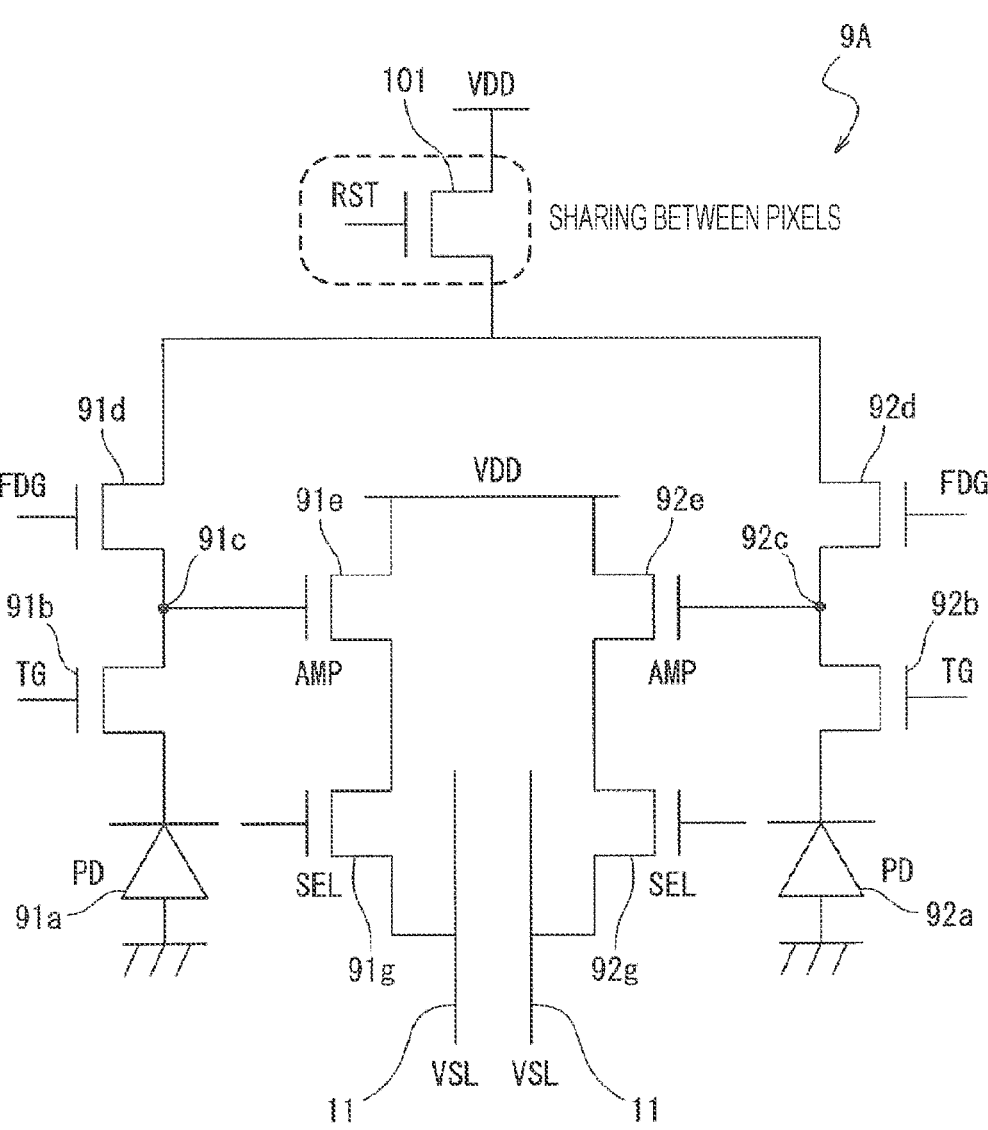
FIG. 6 is a circuit diagram illustrating an equivalent circuit of sharing pixels of a two-pixel sharing system according to a second embodiment of the present technology.

FIG. 6 illustrates an equivalent circuit of sharing pixels 9A of a two-pixel sharing system according to the second embodiment of the present technology. In FIG. 6, the same components as those in FIG. 2 described above are denoted by the same reference signs, and detailed description thereof is omitted.

The drain of the amplification transistor 91*e* for the pixel 91 is connected to the source of a selection transistor 91*g* for the pixel 91. The source of the amplification transistor 91*e* is applied with a power supply potential (VDD). The amplification transistor 91*e* amplifies the potential of the FD portion 91*c*.

The drain of the selection transistor 91*g* is connected to the vertical signal line 11. The selection transistor 91*g* selects the pixel 91 in response to a selection signal applied to the gate. In a case where the pixel 91 is selected, a pixel signal corresponding to the potential amplified by the amplification transistor 91*e* is output through the vertical signal line 11.

The drain of the amplification transistor 92*e* for the pixel 92 is connected to the source of a selection transistor 92*g* for the pixel 92. The source of the amplification transistor 92*e* is applied with the power supply potential (VDD). The amplification transistor 92*e* amplifies the potential of the FD portion 92*c*.

The drain of the selection transistor 92*g* is connected to the vertical signal line 11. The selection transistor 92*g* selects the pixel 92 in response to a selection signal applied to the gate. In a case where the pixel 92 is selected, a pixel signal corresponding to the potential amplified by the amplification transistor 92e is output through the vertical signal line 11.

Effects Produced by Second Embodiment

As described above, also in the second embodiment, effects similar to those in the above-described first embodiment can be produced.

Note that, in the second embodiment, only the selection transistor may be shared by the pixel 91 and the pixel 92.

Third Embodiment

Next, a third embodiment will be described. The third embodiment is a modification of the first embodiment, and will describe a 2×2-pixel sharing system.

Figure 7:
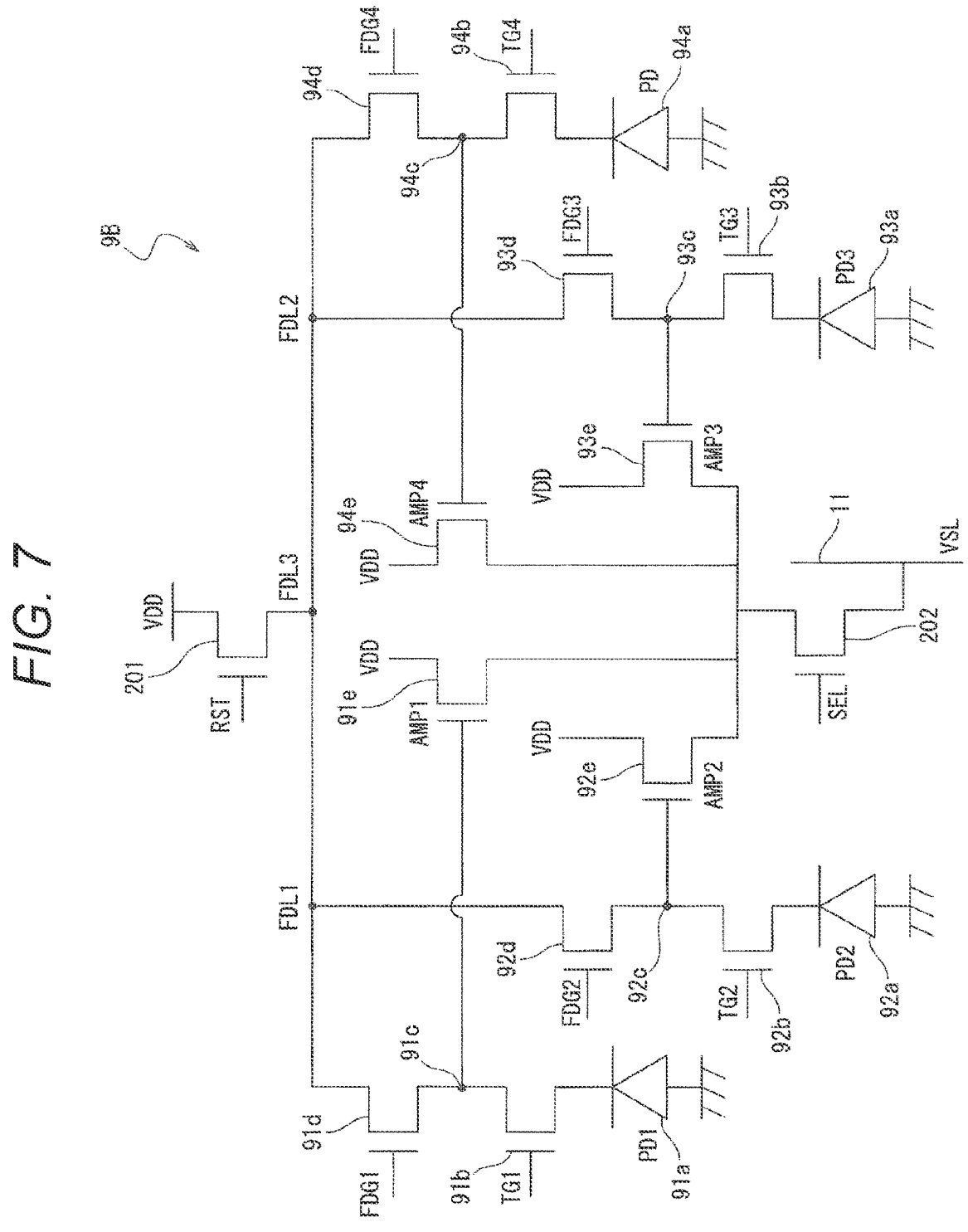
FIG. 7 is a circuit diagram illustrating an equivalent circuit of sharing pixels of a 2×2-pixel sharing system according to a third embodiment of the present technology.

FIG. 7 illustrates an equivalent circuit of sharing pixels 9B of a 2×2-pixel sharing system according to the third embodiment of the present technology. In FIG. 7, the same components as those in FIG. 2 described above are denoted by the same reference signs, and detailed description thereof is omitted.

In the pixel 91, the drain of the conversion-efficiency adjustment transistor 91d is connected to the drain of the conversion-efficiency adjustment transistor 92d for the pixel 92, the drain of the conversion-efficiency adjustment transistor 92d for a pixel 93, the drain of the conversion-efficiency adjustment transistor 92d for a pixel 94, and the source of a reset transistor 201.

Furthermore, in the pixel 91, the drain of the amplification transistor 91e is connected to the source of a selection transistor 202, the drain of the amplification transistor 92e for the pixel 92, the drain of an amplification transistor 93e for the pixel 93, the drain of an amplification transistor 94e for the pixel 94.

In the pixel 92, the drain of the conversion-efficiency adjustment transistor 92d is connected to the drain of the conversion-efficiency adjustment transistor 91d for the pixel 91, the drain of a conversion-efficiency adjustment transistor 93d for the pixel 93, the drain of a conversion-efficiency adjustment transistor 94d for the pixel 94, and the source of the reset transistor 201.

Furthermore, in the pixel 92, the drain of the amplification transistor 92e is connected to the source of the selection transistor 202, the drain of the amplification transistor 91e for the pixel 91, the drain of the amplification transistor 93e for the pixel 93, the drain of the amplification transistor 94e for the pixel 94.

Meanwhile, a photodiode 93a for the pixel 93 forms a photoelectric conversion unit that photoelectrically converts incident light. The anode of the photodiode 93a is grounded. The cathode of the photodiode 93a is connected to the source of a transfer transistor 93b for the pixel 93.

The drain of the transfer transistor 93b is connected to a FD portion 93c for the pixel 93. The transfer transistor 93b transfers signal charge from the photodiode 93a to the FD portion 93c in response to a transfer signal applied to the gate.

The FD portion 93c stores therein the signal charge transferred from the photodiode 93a via the transfer transistor 93b. The potential of the FD portion 93c is modulated in accordance with the amount of signal charge stored in the FD portion 93c.

The FD portion 93c is connected to the source of the conversion-efficiency adjustment transistor 93d. The drain of the conversion-efficiency adjustment transistor 93d is connected to the drain of the conversion-efficiency adjustment transistor 91d for the pixel 91, the drain of the conversion-efficiency adjustment transistor 92d for the pixel 92, the drain of the conversion-efficiency adjustment transistor 94d for the pixel 94, and the source of the reset transistor 201. The conversion-efficiency adjustment transistor 93d adjusts the conversion efficiency of signal charge stored in the FD portion 93c, in response to a conversion-efficiency adjustment signal applied to the gate.

The FD portion 93c is connected to the gate of the amplification transistor 93e. The drain of the amplification transistor 93e is connected to the source of the selection transistor 202, the drain of the amplification transistor 91e for the pixel 91, the drain of the amplification transistor 92e for the pixel 92, the drain of the amplification transistor 94e for the pixel 94. The source of the amplification transistor 93e is applied with the power supply potential (VDD). The amplification transistor 93e amplifies the potential of the FD portion 93c.

Moreover, a photodiode 94a for the pixel 94 forms a photoelectric conversion unit that photoelectrically converts incident light. The anode of the photodiode 94a is grounded. The cathode of the photodiode 94a is connected to the source of a transfer transistor 94b for the pixel 94.

The drain of the transfer transistor 94b is connected to a FD portion 94c for the pixel 94. The transfer transistor 94b transfers signal charge from the photodiode 94a to the FD portion 94c in response to a transfer signal applied to the gate.

The FD portion 94c stores therein the signal charge transferred from the photodiode 94a via the transfer transistor 94b. The potential of the FD portion 94c is modulated in accordance with the amount of signal charge stored in the FD portion 94c.

The FD portion 94c is connected to the source of the conversion-efficiency adjustment transistor 94d. The drain of the conversion-efficiency adjustment transistor 94d is connected to the drain of the conversion-efficiency adjustment transistor 91d for the pixel 91, the drain of the conversion-efficiency adjustment transistor 91d for the pixel 92, the drain of the conversion-efficiency adjustment transistor 93d for the pixel 93, and the source of the reset transistor 201. The conversion-efficiency adjustment transistor 94d adjusts the conversion efficiency of signal charge stored in the FD portion 94c, in response to a conversion-efficiency adjustment signal applied to the gate.

The FD portion 94c is connected to the gate of the amplification transistor 94e. The drain of the amplification transistor 94e is connected to the source of the selection transistor 202, the drain of the amplification transistor 91e for the pixel 91, the drain of the amplification transistor 92e for the pixel 92, the drain of the amplification transistor 93e for the pixel 93. The source of the amplification transistor 94e is applied with the power supply potential (VDD). The amplification transistor 94e amplifies the potential of the FD portion 94c.

The drain of the reset transistor 201 is applied with the power supply potential (VDD). The reset transistor 201 initializes (resets) the signal charge stored in the FD portion 91c, the signal charge stored in the FD portion 92c, the signal charge stored in the FD portion 93c, and the signal charge stored in the FD portion 94c, in response to a reset signal applied to the gate.

The drain of the selection transistor 202 is connected to the vertical signal line 11. The selection transistor 202 selects one of the pixel 91, the pixel 92, the pixel 93, and the pixel 94 in response to a selection signal applied to the gate.

In a case where the pixel 91 is selected, a pixel signal corresponding to the potential amplified by the amplification transistor 91e is output through the vertical signal line 11. On the other hand, in a case where the pixel 92 is selected, a pixel signal corresponding to the potential amplified by the amplification transistor 92e is output through the vertical signal line 11. Furthermore, in a case where the pixel 93 is selected, a pixel signal corresponding to the potential amplified by the amplification transistor 93e is output through the vertical signal line 11. Moreover, in a case where the pixel 94 is selected, a pixel signal corresponding to the potential amplified by the amplification transistor 94e is output through the vertical signal line 11.

Comparative Example of Third Embodiment (Arrangement of Pixel Transistors in 2×2-Pixel Sharing System)

Figure 8:
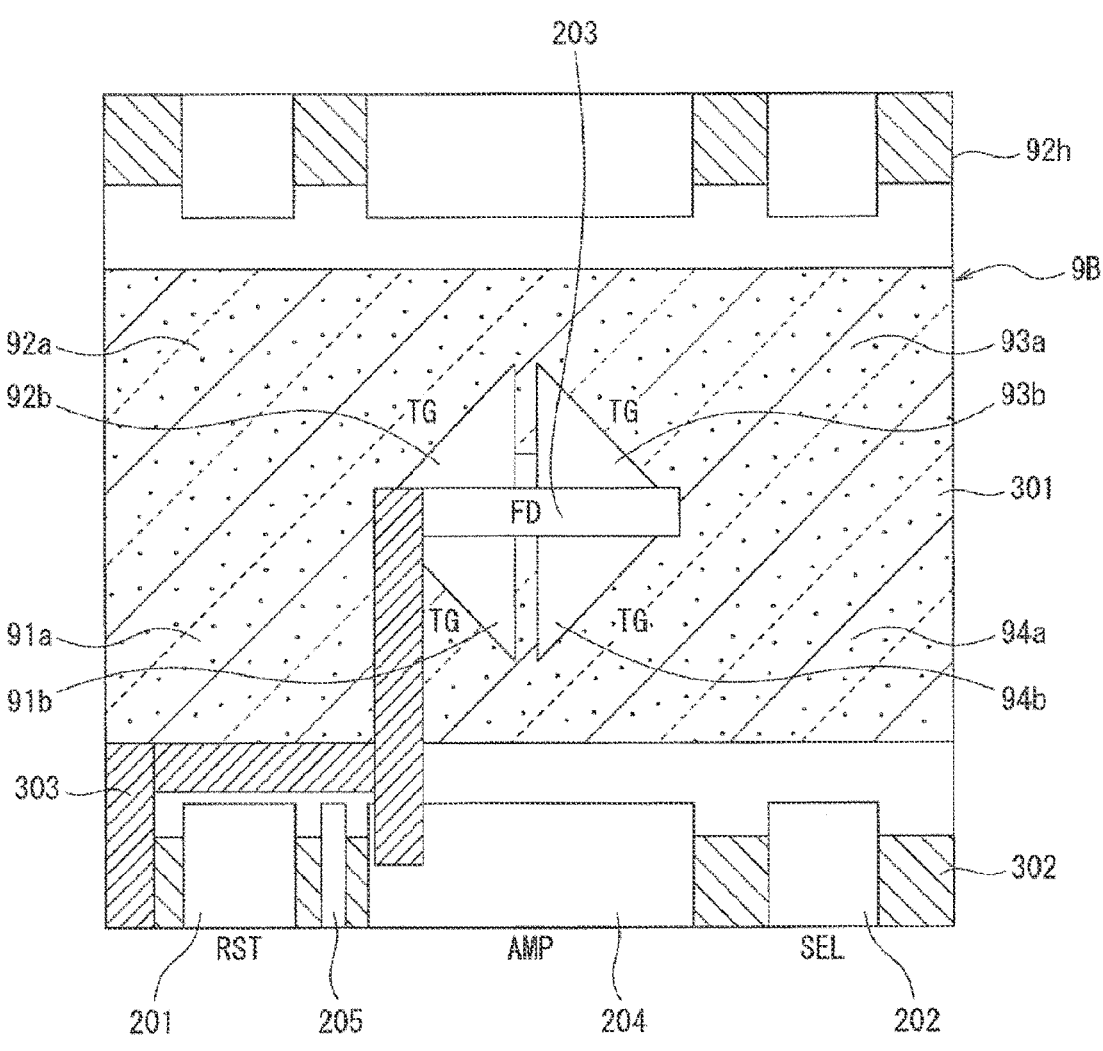
FIG. 8 is a plan view illustrating an arrangement of pixel transistors in pixels of a 2×2-pixel sharing system in a comparative example of the third embodiment.

FIG. 8 is a plan view illustrating an arrangement of pixel transistors in the pixel 91, the pixel 92, the pixel 93, and the pixel 94 of a 2×2-pixel sharing system in a comparative example of the third embodiment. In FIG. 8, the same components as those in FIG. 7 described above are denoted by the same reference signs, and detailed description thereof is omitted.

The photodiode 91a and the transfer transistor (TG) 91b for the pixel 91 are provided in a photoelectric conversion region 301 including the pixels 91, 92, 93, and 94. The photodiode 92a and the transfer transistor (TG) 92b for the pixel 92 are provided in the photoelectric conversion region 301. The photodiode 93a and the transfer transistor (TG) 93b for the pixel 93 are provided in the photoelectric conversion region 301. The photodiode 94a and the transfer transistor (TG) 94b for the pixel 94 are provided in the photoelectric conversion region 301.

Meanwhile, in the comparative example of the third embodiment, in addition to the reset transistor 201 and the selection transistor 202, a FD portion 203, an amplification transistor 204, and a conversion-efficiency adjustment transistor 205 are shared by the pixel 91, the pixel 92, the pixel 93, and the pixel 94. The FD portion 203 is provided in the photoelectric conversion region 301. The reset transistor 201, the selection transistor 202, the amplification transistor 204, and the conversion-efficiency adjustment transistor 205 are provided in a wiring region 302. The photoelectric conversion region 301 and the wiring region 302 are electrically disconnected from each other.

The FD portion 203 is connected to the reset transistor 201 and the amplification transistor 204 by a FD wire 303. In the 2×2-pixel sharing system of this comparative example, though the PD area can be increased, a distance between the FD portion 203 and the amplification transistor 204 is increased, so that the length of the FD wire 303 is increased. Furthermore, in the 2×2-pixel sharing system of the comparative example, the transfer transistor 91b for the pixel 91, the transfer transistor 92b for the pixel 92, the transfer transistor 93b for the pixel 93, and the transfer transistor 94b for the pixel 94 are placed so as to face each other to share the FD portion 203, and thus the optical symmetry is broken.

Measures According to Third Embodiment

Figure 9:
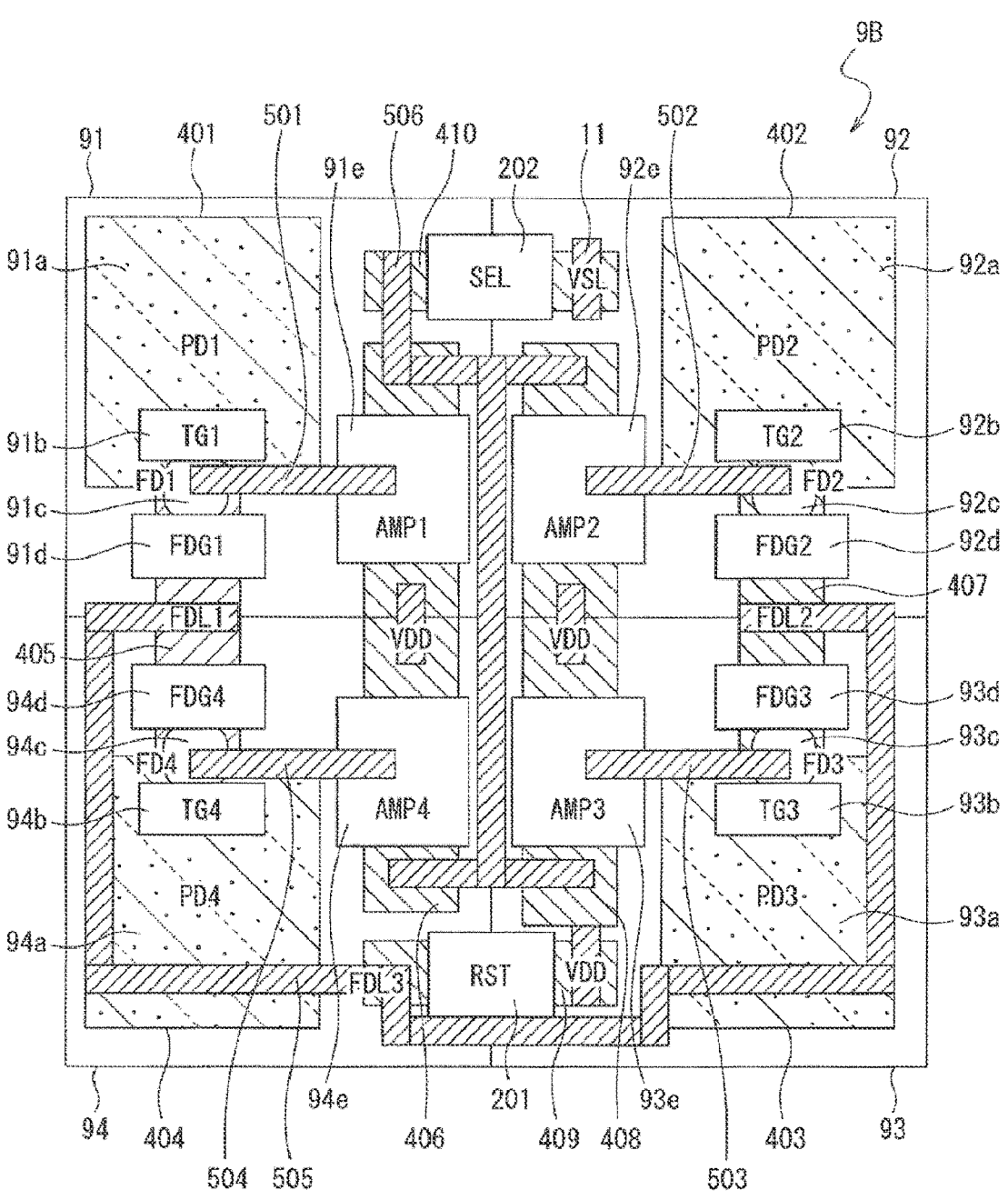
FIG. 9 is a plan view illustrating an arrangement of pixel transistors in pixels of a 2×2-pixel sharing system according to the third embodiment.

In the third embodiment of the present technology, as illustrated in FIG. 9, the reset transistor 201 and the selection transistor 202 are shared by the pixel 91, the pixel 92, the pixel 93, and the pixel 94. In FIG. 9, the same components as those in FIG. 8 described above are denoted by the same reference signs, and detailed description thereof is omitted.

In the pixel 91, the photodiode 91a and the transfer transistor 91b are provided in a photoelectric conversion region 401. In the pixel 92, the photodiode 92a and the transfer transistor 92b are provided in a photoelectric conversion region 402. In the pixel 92, the photodiode 92a and the transfer transistor 92b are provided in a photoelectric conversion region 402. In the pixel 93, the photodiode 93a and the transfer transistor 93b are provided in a photoelectric conversion region 403. In the pixel 94, the photodiode 94a and the transfer transistor 94b are provided in a photoelectric conversion region 404.

The conversion-efficiency adjustment transistor 91d for the pixel 91 and the conversion-efficiency adjustment transistor 94d for the pixel 94 are provided in a wiring region 405. The amplification transistor 91e for the pixel 91 and the amplification transistor 94e for the pixel 94 are provided in a wiring region 406. The wiring region 406 is connected to the supply line of the power supply potential (VDD).

The conversion-efficiency adjustment transistor 92d for the pixel 92 and the conversion-efficiency adjustment transistor 93d for the pixel 93 are provided in a wiring region 407. The amplification transistor 92e for the pixel 92 and the amplification transistor 93e for the pixel 93 are provided in a wiring region 408. The wiring region 408 is connected to the supply line of the power supply potential (VDD).

The reset transistor 201 is provided in a wiring region 409. The wiring region 409 is connected to the supply line of the power supply potential (VDD). The selection transistor 202 is provided in a wiring region 410. The wiring region 410 is connected to the vertical signal line 11.

The FD portion 91c for the pixel 91 is provided between the photoelectric conversion region 401 and the wiring region 405. The FD portion 92c for the pixel 92 is provided between the photoelectric conversion region 402 and the wiring region 407. The FD portion 93c for the pixel 93 is provided between the photoelectric conversion region 403 and the wiring region 407. The FD portion 94c for the pixel 94 is provided between the photoelectric conversion region 404 and the wiring region 405. Note that the photoelectric conversion regions 401, 402, 403, and 404 and the wiring regions 405, 406, 407, 408, 409, and 410 are electrically disconnected from each other.

Meanwhile, in the pixel 91, the FD portion 91c and the amplification transistor 91e are electrically connected by a wire 501. In the pixel 92, the FD portion 92c and the amplification transistor 92e are electrically connected by a wire 502. In the pixel 93, the FD portion 93c and the amplification transistor 93e are electrically connected by a wire 503. In the pixel 94, the FD portion 94c and the amplification transistor 94e are electrically connected by a wire 504.

A connection point (FDL1) between the conversion-efficiency adjustment transistor 91d and the conversion-efficiency adjustment transistor 94d, a connection point (FDL2) between the conversion-efficiency adjustment transistor 92d and the conversion-efficiency adjustment transistor 93d, and a connection point (FDL3) of the wiring region 409 where the reset transistor 201 is provided are electrically connected by a wire 505.

The amplification transistor 91e, the amplification transistor 92e, the amplification transistor 93e, the amplification transistor 94e, and the selection transistor 202 are electrically connected by a wire 506.

In the third embodiment of the present technology, the wire 505 is placed along the outer edge of the sharing pixels 9B outside the wires 501, 502, 503, and 504. Furthermore, in a case where the respective amplification transistors 91e, 92e, 93e, and 94e of the pixels 91, 92, 93, and 94 are arranged on the central side of the sharing pixels 9B, the wire 506 is placed so as to pass through the center of the sharing pixels 9B.

Effects Produced by Third Embodiment

As described above, according to the third embodiment, in a case where the respective amplification transistors 91e, 92e, 93e, and 94e of the pixels 91, 92, 93, and 94 are arranged on the central side of the sharing pixels 9B as in the 2×2 pixel sharing system, for example, the wire 505 is placed along the outer edge that is a vacant space in the sharing pixels 9B, and the wire 506 is placed so as to pass through the center of the sharing pixels 9B. This allows the respective wires 501, 502, 503, and 504 of the pixels 91, 92, 93, and 94 to be designed to have small lengths without being affected by the wires 505 and 506.

Other Embodiments

As described above, the present technology has been described by way of the first to third embodiments, but it should not be understood that the description and drawings constituting a part of this disclosure limit the present technology. To understand the gist of the technical contents disclosed in the first to third embodiments described above will make it clear to those skilled in the art that various alternative embodiments, examples, and operation techniques can be included in the present technology. Furthermore, the configurations disclosed in the first to third embodiments, respectively, can be appropriately combined within a range in which no contradiction occurs. For example, the configurations disclosed by a plurality of different embodiments, respectively, may be combined, or the configurations disclosed by a plurality of different modifications of the same embodiment, respectively, may be combined.

<Example of Application to Electronic Apparatus>

Figure 10:
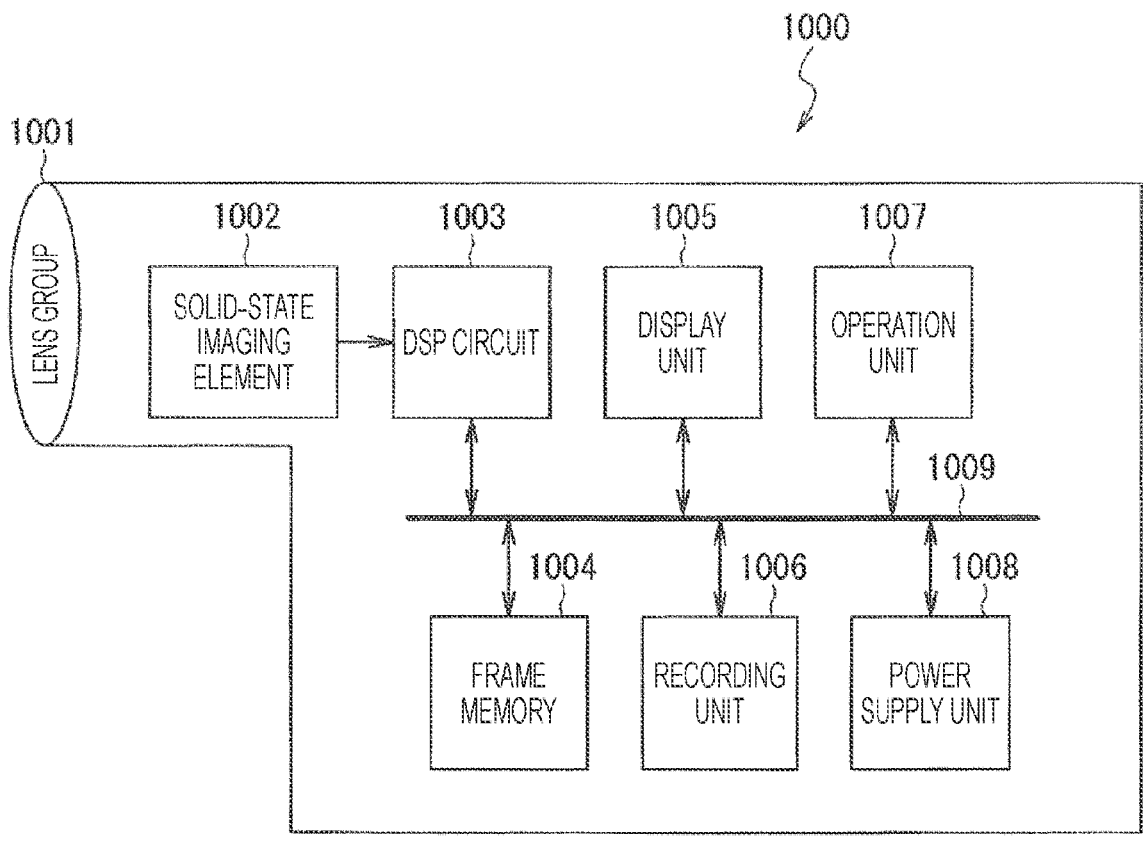
FIG. 10 is a block diagram illustrating a configuration example of an embodiment of an imaging device as an electronic apparatus to which the present technology is applied.

FIG. 10 is a block diagram illustrating a configuration example of an embodiment of an image capture apparatus as an electronic apparatus to which the present technology is applied.

An image capture apparatus 1000 in FIG. 10 is a video camera, a digital still camera, or the like. The image capture apparatus 1000 includes a lens group 1001, a solid-state imaging element 1002, a DSP circuit 1003, a frame memory 1004, a display unit 1005, a recording unit 1006, an operation unit 1007, and a power supply unit 1008. The DSP circuit 1003, the frame memory 1004, the display unit 1005, the recording unit 1006, the operation unit 1007, and the power supply unit 1008 are connected to each other through a bus line 1009.

The lens group 1001 takes in incident light (image light) from a subject and forms an image on an imaging surface of the solid-state imaging element 1002. The solid-state imaging element 1002 includes the first to 14th embodiments of the solid-state imaging device described above. The solid-state imaging element 1002 converts the amount of incident light formed on an imaging surface by the lens group 1001, into an electrical signal on a pixel-by-pixel basis, and supplies the electrical signal as a pixel signal, to the DSP circuit 1003.

The DSP circuit 1003 performs predetermined image processing on the pixel signal supplied from the solid-state imaging element 1002, and supplies the image signal having been subjected to the image processing to the frame memory 1004 on a frame-by-frame basis, to temporarily store the image signal in the frame memory 1004.

The display unit 1005 includes, for example, a panel display device such as a liquid crystal panel or an organic electro luminescence (EL) panel, and displays an image in response to a pixel signal temporarily stored in the frame memory 1004 for each frame.

The recording unit 1006 includes a digital versatile disk (DVD), a flash memory, or the like, and reads and records a pixel signal temporarily stored in the frame memory 1004 for each frame.

The operation unit 1007 gives operation commands for various functions of the image capture apparatus 1000 under the control of a user. The power supply unit 1008 supplies power to the DSP circuit 1003, the frame memory 1004, the display unit 1005, the recording unit 1006, and the operation unit 1007 as appropriate.

The electronic apparatus to which the present technology is applied may be any apparatus that uses a solid-state imaging element as an image capture unit (photoelectric conversion unit), and includes a mobile terminal device having an imaging function, a copying machine using a solid-state imaging element as an image reading unit, and the like, in addition to the image capture apparatus 1000.

Note that the present disclosure can also have the following configurations.

(1)

A solid-state imaging device including a plurality of pixels arranged in a matrix, in which each of the plurality of pixels includes:

a photoelectric conversion unit configured to photoelectrically convert incident light;

a floating diffusion portion in which signal charge generated by the photoelectric conversion unit is stored;

an amplification transistor configured to amplify a potential corresponding to an amount of the signal charge stored in the floating diffusion portion, and output a pixel signal corresponding to the amplified potential; and a conversion-efficiency adjustment transistor configured to adjust a conversion efficiency of the signal charge stored in the floating diffusion portion, and at least a part of the plurality of pixels forms sharing pixels, and a transistor other than the amplification transistor and the conversion-efficiency adjustment transistor is shared by a plurality of pixels forming the sharing pixels.

(2)

The solid-state imaging device according to (1) described above, in which the transistor shared by the sharing pixels includes a reset transistor configured to reset the signal charge stored in the floating diffusion portion.

(3)

The solid-state imaging device according to (1) described above, in which the transistor shared by the sharing pixels includes a selection transistor configured to selectively derive a pixel signal output from the amplification transistor of each of the plurality of pixels.

(4)

The solid-state imaging device according to (1) described above, in which the transistor shared by the sharing pixels includes:

a reset transistor configured to reset the signal charge stored in the floating diffusion portion; and a selection transistor configured to selectively derive a pixel signal output from the amplification transistor of each of the plurality of pixels.

(5)

The solid-state imaging device according to (1) described above, further including:

a first wire electrically connecting the floating diffusion portion and the amplification transistor;

a second wire electrically connecting the plurality of conversion-efficiency adjustment transistors; and a third wire electrically connecting the plurality of amplification transistors, in which the transistor shared by the sharing pixels is electrically connected to the second wire or the third wire.

(6)

The solid-state imaging device according to (5) described above, in which the transistor shared by the sharing pixels includes a reset transistor configured to reset the signal charge stored in the floating diffusion portion, and the reset transistor is electrically connected to the second wire.

(7)

The solid-state imaging device according to (5) described above, in which the transistor shared by the sharing pixels includes a selection transistor configured to selectively derive a pixel signal output from the amplification transistor of each of the plurality of pixels, and the selection transistor is electrically connected to the third wire.

(8)

The solid-state imaging device according to (5) described above, in which the transistor shared by the sharing pixels includes: a reset transistor configured to reset the signal charge stored in the floating diffusion portion; and a selection transistor configured to selectively derive a pixel signal output from the amplification transistor of each of the plurality of pixels, the reset transistor is electrically connected to the second wire, and the selection transistor is electrically connected to the third wire.

(9)

The solid-state imaging device according to (5) described above, in which the second wire is placed along an outer edge of the sharing pixels outside the first wire.

(10)

The solid-state imaging device according to (5) described above, in which the third wire is placed along an outer edge of the sharing pixels outside the first wire.

(11)

The solid-state imaging device according to (5) described above, in which the second wire is placed along an outer edge of the sharing pixels outside the first wire, and the third wire is placed so as to pass through a center of the sharing pixels in a case where the amplification transistor of each of the plurality of pixels is placed on a central side of the sharing pixels.

(12)

The solid-state imaging device according to (1) described above, in which each of the plurality of pixels includes a transfer transistor configured to transfer the signal charge generated by the photoelectric conversion unit to the floating diffusion portion.

(13)

An electronic apparatus including a solid-state imaging device including a plurality of pixels arranged in a matrix, in which each of the plurality of pixels includes:

a photoelectric conversion unit configured to photoelectrically convert incident light;

a floating diffusion portion in which signal charge generated by the photoelectric conversion unit is stored;

an amplification transistor configured to amplify a potential corresponding to an amount of the signal charge stored in the floating diffusion portion, and output a pixel signal corresponding to the amplified potential; and a conversion-efficiency adjustment transistor configured to adjust a conversion efficiency of the signal charge stored in the floating diffusion portion, and at least a part of the plurality of pixels forms sharing pixels, and a transistor other than the amplification transistor and the conversion-efficiency adjustment transistor is shared by a plurality of pixels forming the sharing pixels.

REFERENCE SIGNS LIST

1 Solid-state imaging device
2 Substrate
3 Pixel region
4 Vertical drive circuit
5 Column signal processing circuit
6 Horizontal drive circuit
7 Output circuit
8 Control circuit
9, 9A, 9B Sharing pixel
10 Pixel drive wire
11 Vertical signal line
12 Horizontal signal line
91, 92, 93, 94 Pixel
91a, 92a, 93a, 94a Photodiode
91b, 92b, 93b, 94b Transfer transistor
91c, 92c, 93c, 94, 103, 203 FD portion
91d, 92d, 93d, 94f, 105, 205 Conversion-efficiency adjustment transistor
91e, 92e, 93e, 94e, 104, 204 Amplification transistor
91g, 92g, 102, 202 Selection transistor
91h, 92h, 301, 401, 402, 403, 404 Photoelectric conversion region
91i, 91j, 91l, 91m, 91n, 92m, 92n, 302, 405, 406, 407, 408, 409,
410 Wiring region
91k, 106, 303 FD wire
101, 201 Reset transistor
111, 112, 113, 114, 501, 502, 503, 504, 505, 506 Wire
1000 Image capture apparatus
1001 Lens group
1002 Solid-state imaging element
1003 DSP circuit
1004 Frame memory
1005 Display unit
1006 Recording unit
1007 Operation unit
1008 Power supply unit
1009 Bus line

The invention claimed is:

1. A solid-state imaging device, comprising:
a plurality of pixels in a matrix, wherein each of the plurality of pixels includes:
a photoelectric conversion unit configured to:
photoelectrically convert incident light; and
generate signal charge based on the photoelectric conversion of the incident light;
a floating diffusion portion configured to store the signal charge;
an amplification transistor configured to:
amplify a potential corresponding to an amount of the signal charge stored in the floating diffusion portion; and
output a pixel signal corresponding to the amplified potential; and
a conversion-efficiency adjustment transistor configured to adjust a conversion efficiency of the signal charge stored in the floating diffusion portion, wherein
a set of pixels of the plurality of pixels corresponds to sharing pixels, and
a specific transistor different from the amplification transistor and the conversion-efficiency adjustment transistor is shared by the set of pixels;
a first wire configured to electrically connect the floating diffusion portion and the amplification transistor;
a second wire configured to electrically connect the conversion-efficiency adjustment transistor of the each of the plurality of pixels; and
a third wire configured to electrically connect the amplification transistor of the each of the plurality of pixels, wherein
the specific transistor is electrically connected to one of the second wire or the third wire.

2. The solid-state imaging device according to claim 1, wherein the specific transistor includes a reset transistor configured to reset the signal charge stored in the floating diffusion portion.

3. The solid-state imaging device according to claim 1, wherein the specific transistor includes a selection transistor configured to selectively derive the pixel signal output from the amplification transistor of the each of the plurality of pixels.

4. The solid-state imaging device according to claim 1, wherein the specific transistor includes:
a reset transistor configured to reset the signal charge stored in the floating diffusion portion; and
a selection transistor configured to selectively derive the pixel signal output from the amplification transistor of the each of the plurality of pixels.

5. The solid-state imaging device according to claim 1, wherein
the specific transistor includes a reset transistor configured to reset the signal charge stored in the floating diffusion portion, and
the reset transistor is electrically connected to the second wire.

6. The solid-state imaging device according to claim 1, wherein
the specific transistor includes a selection transistor configured to selectively derive the pixel signal output from the amplification transistor of the each of the plurality of pixels, and
the selection transistor is electrically connected to the third wire.

7. The solid-state imaging device according to claim 1, wherein the specific transistor includes:
a reset transistor configured to reset the signal charge stored in the floating diffusion portion; and
a selection transistor configured to selectively derive the pixel signal output from the amplification transistor of the each of the plurality of pixels,
the reset transistor is electrically connected to the second wire, and
the selection transistor is electrically connected to the third wire.

8. The solid-state imaging device according to claim 1, wherein the second wire is along an outer edge of the sharing pixels outside the first wire.

9. The solid-state imaging device according to claim 1, wherein the third wire is along an outer edge of the sharing pixels outside the first wire.

10. The solid-state imaging device according to claim 1, wherein
the second wire is an outer edge of the sharing pixels outside the first wire, and
the third wire is further configured to pass through a center of the sharing pixels based on the amplification transistor of the each of the plurality of pixels that is on a central side of the sharing pixels.

11. The solid-state imaging device according to claim 1, wherein the each of the plurality of pixels further includes a transfer transistor configured to transfer the signal charge generated by the photoelectric conversion unit to the floating diffusion portion.

12. An electronic apparatus, comprising:
a solid-state imaging device;
a lens group configured to transmit incident light on an imaging surface of the solid-state imaging device, wherein
the solid-state imaging device includes a plurality of pixels in a matrix, and
each of the plurality of pixels includes:
a photoelectric conversion unit configured to:
photoelectrically convert the incident light; and
generate signal charge based on the photoelectric conversion of the incident light;
a floating diffusion portion configured to store the signal charge;
an amplification transistor configured to:
amplify a potential corresponding to an amount of the signal charge stored in the floating diffusion portion; and
output a pixel signal corresponding to the amplified potential; and
a conversion-efficiency adjustment transistor configured to adjust a conversion efficiency of the signal charge stored in the floating diffusion portion, wherein
a set of pixels of the plurality of pixels corresponds to sharing pixels, and
a specific transistor different from the amplification transistor and the conversion-efficiency adjustment transistor is shared by the set of pixels;
a first wire configured to electrically connect the floating diffusion portion and the amplification transistor;
a second wire configured to electrically connect the conversion-efficiency adjustment transistor of the each of the plurality of pixels; and a third wire configured to electrically connect the ampli-
fication transistor of the each of the plurality of pixels,
wherein
the specific transistor is electrically connected to one of
the second wire or the third wire.

* * * * *